United States Patent
Tu et al.

(10) Patent No.: US 11,049,961 B2
(45) Date of Patent: Jun. 29, 2021

(54) HIGH ELECTRON MOBILITY TRANSISTOR AND METHODS FOR MANUFACTURING THE SAME

(71) Applicant: EPISTAR CORPORATION, Hsinchu (TW)

(72) Inventors: Shang-Ju Tu, Hsinchu (TW); Chia-Cheng Liu, Hsinchu (TW); Tsung-Cheng Chang, Hsinchu (TW); Ya-Yu Yang, Hsinchu (TW); Yu-Jiun Shen, Hsinchu (TW); Jen-Inn Chyi, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 29 days.

(21) Appl. No.: 16/453,118

(22) Filed: Jun. 26, 2019

(65) Prior Publication Data

US 2020/0006543 A1    Jan. 2, 2020

(30) Foreign Application Priority Data

Jun. 28, 2018    (TW) .................................. 107122389

(51) Int. Cl.
*H01L 29/778* (2006.01)
*H01L 29/417* (2006.01)
*H01L 29/66* (2006.01)

(52) U.S. Cl.
CPC ...... *H01L 29/778* (2013.01); *H01L 29/41725* (2013.01); *H01L 29/66431* (2013.01)

(58) Field of Classification Search
CPC ............. H01L 29/778; H01L 29/41725; H01L 29/66431; H01L 29/66462; H01L 29/267; H01L 29/432; H01L 29/1066; H01L 29/2003; H01L 29/7786; H01L 29/0603; H01L 29/0684
See application file for complete search history.

(56) References Cited

U.S. PATENT DOCUMENTS

| 9,761,675 B1* | 9/2017 | Marinella ......... H01L 29/42316 |
| 2012/0049180 A1* | 3/2012 | Yamada ................ H01L 29/513 |
| | | 257/43 |

OTHER PUBLICATIONS

Mizutani et al. ("AlGaN/GaN HEMT's with thin InGaN cap layer for normally off operation," IEEE Electron Device Letters, vol. 7, Jul. 2007) (Year: 2007).*
Soman et al. ("Buried channel normally-off AlGaN/GaN MOS-HEMT with a p-n junction in GaN buffer," Semiconductor Sci. Technol. 33 095006, 2018) (Year: 2018).*
Wang et al. ("Polarity control of ZnO films grown on nitrided-sapphire by molecular-beam epitaxy," Appl. Phys. Lett. 86, 011921, 2005) (Year: 2005).*

* cited by examiner

*Primary Examiner* — Yasser A Abdelaziez
(74) *Attorney, Agent, or Firm* — Muncy, Geissler, Olds & Lowe, P.C.

(57) ABSTRACT

A high electron mobility transistor, includes a substrate; a channel layer formed on the substrate; a barrier layer formed on the channel layer; a source electrode and a drain electrode formed on the barrier layer; a depletion layer formed on the barrier layer and between the source electrode and the drain electrode, wherein a material of the depletion layer comprises boron nitride or zinc oxide; and a gate electrode formed on the depletion layer.

15 Claims, 6 Drawing Sheets

HIGH ELECTRON MOBILITY TRANSISTOR AND METHODS FOR MANUFACTURING THE SAME

CROSS-REFERENCE TO RELATED APPLICATIONS

This application claims priority to the benefit of Taiwan Application Serial Number 107122389 filed on Jun. 28, 2018, and the entire contents of which are hereby incorporated by reference herein in its entirety.

BACKGROUND

Technical Field

The present application relates to a transistor, and more particularly to a high electron mobility transistor and a manufacturing method thereof.

Description of the Related Art

In recent years, due to the increasing demand for high frequency and high power devices, GaN power devices such as high electron mobility transistors (HEMTs) including AlGaN/GaN are widely used in power supply, DC/DC converter, DC/AC inverter and industrial applications such as electronic product, uninterruptible power system, automobile, motor, and wind power due to their high electron mobility, high switching speeds, and the operating characteristics suitable for high-frequency, high-power and high-temperature.

Conventional HEMT is typically a normally-on device. Therefore, the HEMT should be biased at a negative voltage for being in off-state, which limits the application of the HEMT.

SUMMARY

A high electron mobility transistor, includes a substrate; a channel layer formed on the substrate; a barrier layer formed on the channel layer; a source electrode and a drain electrode formed on the barrier layer; a depletion layer formed on the barrier layer and between the source electrode and the drain electrode, wherein a material of the depletion layer comprises boron nitride or zinc oxide; and a gate electrode formed on the depletion layer.

A method of manufacturing a high electron mobility transistor, including: forming a channel layer; forming a barrier layer on the channel layer; forming a depletion layer on the barrier; forming a source electrode and a drain electrode on the barrier layer; and forming a gate electrode on the depletion layer; wherein a material of the depletion layer comprises boron nitride or zinc oxide.

DETAILED DESCRIPTION OF THE EMBODIMENTS

Figure 1A:
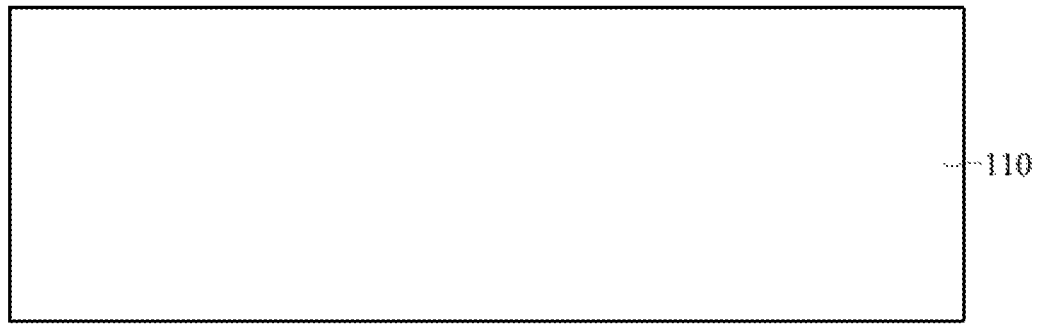
FIGS. 1A-1D show cross-sectional views of a HEMT in each manufacturing process in accordance with an embodiment of the present application.

In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions are used. For example, "under", "on", "lower", "bottom", "higher" or "top" are used to describe the position of one element relative to another. It should be appreciated that if a device is flipped upside down, an element that is "lower" or "under" will become an element that is "higher" or "on". Terms concerning attachments, coupling and the like, such as "connected" and "interconnected," refer to a relationship wherein structures are secured or attached to one another either directly or indirectly through intervening structures, unless expressly described otherwise.

The stated value of the present application is an approximate value. When there is no specific description, the stated value includes the meaning of "about" or "substantially". The terms "about" and "substantially" typically mean+/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value.

It should be understood that, although the terms first, second, third, etc. may be used herein to describe various elements, components, regions, layers, portions and/or sections, these elements, components, regions, layers, portions and/or sections should not be limited by these terms. These terms are only used to distinguish one element, component, region, layer, portion or section from another region, layer or section. Thus, a first element, component, region, layer, portion or section discussed below could be termed a second element, component, region, layer, portion or section without departing from the teachings of the present application.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

This description of the exemplary embodiments is intended to be read in connection with the accompanying drawings, which are to be considered part of the entire written description. The drawings are not drawn to scale. In addition, structures and devices are shown schematically in order to simplify the drawing.

FIGS. 1A to 1D respectively show cross-sectional views of a HEMT 100A during each manufacturing process in accordance with a first embodiment of the present application. As shown in FIG. 1A, a substrate 110 is provided. The material of the substrate 110 comprises semiconductor or non-semiconductor, wherein the semiconductor comprises silicon (Si), gallium nitride (GaN), silicon carbide (SiC), gallium arsenide (GaAs) and the non-semiconductor comprises sapphire. In addition, the substrate 110 can be classified by conductivity as a conductive substrate or an insulating substrate. The conductive substrate includes Si substrate, SiC substrate, GaN substrate, GaAs substrate. The insulating substrate includes sapphire substrate, AlN substrate, or semiconductor-on-insulator (SOI) substrate. In the present embodiment, the substrate 110 is a Si substrate. In one embodiment, the substrate 110 may be a wafer, such as a Si wafer. The Si wafer is subsequently divided into a plurality of HEMTs 100A after completing the fabrication process of the HEMTs 100A on the Si wafer.

Figure 1B:
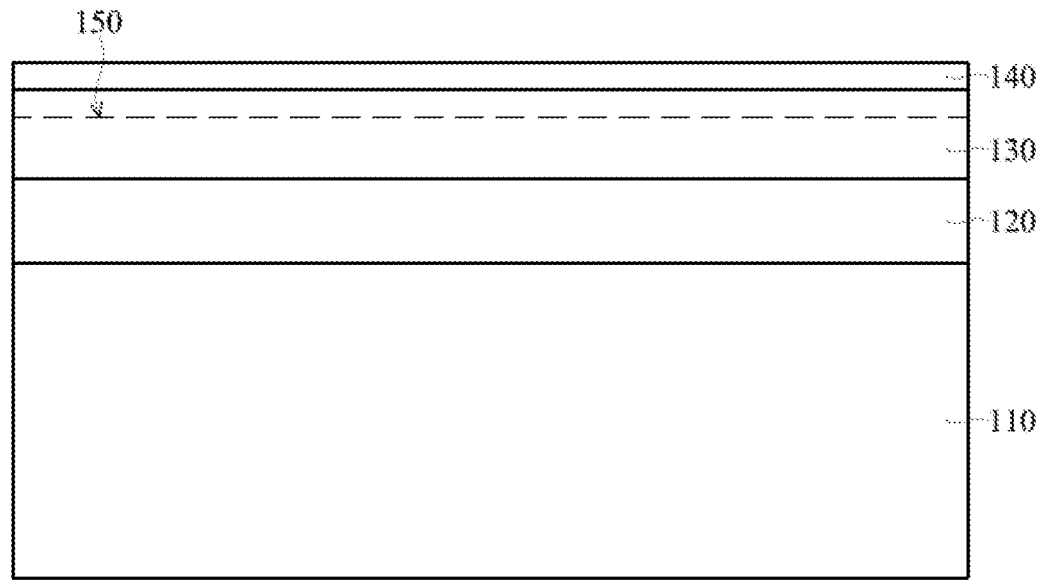

Next, as shown in FIG. 1B, a buffer layer 120, a channel layer 130 and a barrier layer 140 are sequentially formed on the substrate 110. The buffer layer 120 is used to reduce the strain which is generated due to the difference between thermal expansion coefficients of the substrate 110 and the channel layer 130 or to reduce lattice defects caused by lattice mismatch of each other. The buffer layer 120 has a thickness of between 0.1 μm and 10 μm. The buffer layer 120 can be a single layer including a single material or a composite structure including a plurality of layers of different materials. The material of the buffer layer 120 is selected from GaN, AlN, AlGaN, AlInN, AlInGaN and a combination thereof. For example, the buffer layer 120 is a composite structure composed of an AlGaN layer and a GaN layer alternately stacked. In addition, the buffer layer 120 may be doped with impurity such as carbon, wherein the doping concentration of carbon may be graded or fixed depending on the growth direction. The buffer layer 120 may further comprise a nucleation layer (not shown) composed of a single layer or a composite structure. For example, the nucleation layer is a single layer with AlN and has a thickness of about 50 nm to 500 nm. In another embodiment, the nucleation layer is a composite structure with a low-temperature epitaxially grown AlN sub-layer (with a thickness of 40 nm) and a high-temperature epitaxially grown AlN sub-layer (with a thickness of 150 nm) alternately stacked.

The channel layer 130 is formed on the buffer layer 120. The channel layer 130 is composed of III-V compound semiconductor and has a first energy gap and a thickness of 50 nm to 10 μm. In the present embodiment, the channel layer 130 includes $In_xGa_{(1-x)}N$, wherein 0≤x<1. As shown in FIG. 1B, a barrier layer 140 is formed on the channel layer 130. The thickness of the barrier layer 140 ranges from 10 nm to 50 nm. The barrier layer 140 is composed of III-V compound semiconductor and has a second energy gap. In the present embodiment, the barrier layer 140 includes $Al_yIn_zGa_{(1-y-z)}N$, wherein 0<y<1 and 0≤z<1.

As shown in FIG. 1B, a heterojunction is formed between the channel layer 130 and the barrier layer 140. Spontaneous polarization is induced by the channel layer 130 and the barrier layer 140 and piezoelectric polarization is generated due to different lattice constants of the channel layer 130 and the barrier layer 140. As a result, the bandgap bends near the heterojunction in the channel layer 130 and thereby a two-dimensional electron gas (2DEG) 150 is formed in the channel layer 130 (shown by a broken line in FIG. 1B). The concentration of the 2DEG 150 is related to the thickness of the barrier layer 140. When the thickness of the barrier layer 140 is larger, the electron concentration of the 2DEG 150 is higher. In addition, the aluminum content of the barrier layer 140 also affects the concentration of the 2DEG 150. The higher the aluminum content of the barrier layer 140 is (that is, the stronger the piezoelectric polarization of the barrier layer 140 is), the stronger the piezoelectric field generated between the channel 130 and the barrier layer 140. As a result, the electron concentration of the 2DEG 150 becomes higher.

The buffer layer 120, the channel layer 130 and the barrier layer 140 can be formed by chemical vapor deposition (CVD), metal organic chemical vapor deposition (MOCVD), molecular beam epitaxy (MBE), physical vapor deposition (PVD), atomic layer deposition (ALD), coating, sputtering, or other suitable deposition process.

Figure 1C:
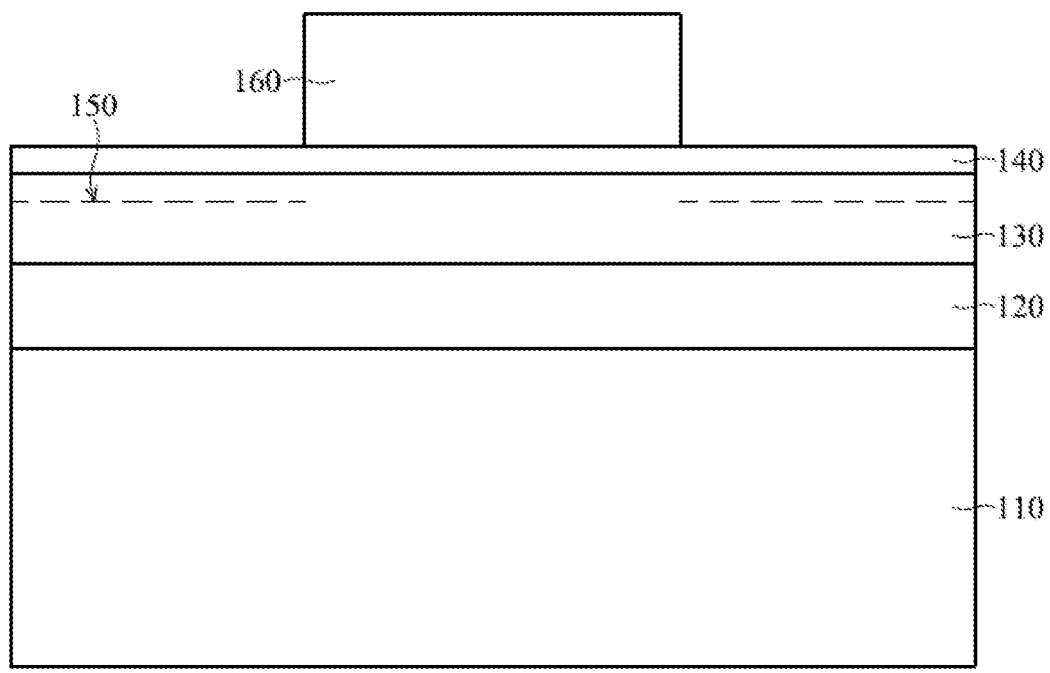

Next, as shown in FIG. 1C, a depletion layer 160 is formed on the barrier layer 140. The depletion layer 160 has a reverse polarization effect on the barrier layer 140, thereby reducing or depleting the electron concentration of the 2DEG 150 in the channel layer 130. The HEMT 100A that is completed is in off-state when no bias is applied thereon and thus the HEMT 100A is also referred to as a normally-off HEMT. The thickness of the depletion layer 160 is between 50 nm and 100 nm. In one embodiment, the material of the depletion layer 160 comprises a semiconductor material of a single crystal III-V compound, such as hexagonal boron nitride (hexagonal-BN, hBN). In another embodiment, the material of the depletion layer 160 comprises a semiconductor material of a single crystal II-VI compound, such as hexagonal zinc oxide (ZnO). If hexagonal ZnO is chosen as the material of the depletion layer 160, the etching selectivity of the hexagonal ZnO of the depletion layer 160 to the AlGaN material of the barrier layer 140 is high. Therefore, when the hexagonal ZnO is etched to form a patterned depletion layer 160, the etching can be accurately stopped at the barrier layer 140 to avoid over-etching.

In addition, the depletion layer 160 can be doped with impurities, and after being activated, the impurities replace a part of the atoms in the crystal of the depletion layer 160. For example, the boron in the boron nitride or the oxygen in the zinc oxide is replaced. Holes are produced in depletion layer 160 such that the depletion layer 160 becomes a p-type depletion layer. In the above hexagonal boron nitride, the doped impurity includes one material selected from Mg, Be, Zn and Cd. In the above hexagonal zinc oxide, the doped impurity includes nitrogen or phosphor. Compared with magnesium, nitrogen or phosphor is more stable and is less likely to diffuse into other layers under the depletion layer 160 at the high temperature environment in the subsequent process and then affecting the characteristics of the transistor. Depending on the material of the depletion layer 160, the energy required for activating the impurities (i.e., activation energy) is also different, thereby affecting the hole concentration in the depletion layer 160. Conventionally, if the material of the depletion layer 160 is $Al_xGa_{(1-x)}N$, wherein $0 \leq x \leq 1$ and doped with Mg, the activation energy required to activate Mg increases from 170 meV to 530 meV as the aluminum content increases. The higher activation energy indicates that activating the impurities in the depletion layer 160 is more difficult. As a result, the hole concentration in the depletion layer 160 decreases in a certain activation condition, thereby affecting the depletion ability of the depletion layer 160.

In one embodiment, if hexagonal boron nitride is chosen as the material of the depletion layer 160, impurity such as Mg can be doped into the depletion layer 160 and then be activated at a temperature between 600° C. and 800° C. At this time, the activation energy for activating Mg is 31 meV. The hole concentration in the depletion layer 160 is increased due to the reduction of the activation energy. Therefore, the bandgap of the barrier layer 140 can be higher than Fermi level to reduce the electron concentration of the 2DEG 150 directly under the depletion layer 160 or to deplete the 2DEG 150. In one embodiment, the doping concentration of the impurity Mg is between $1 \times 10^{19}$ atoms/$cm^3$ to $1 \times 10^{21}$ atoms/$cm^3$.

Figure 1D:
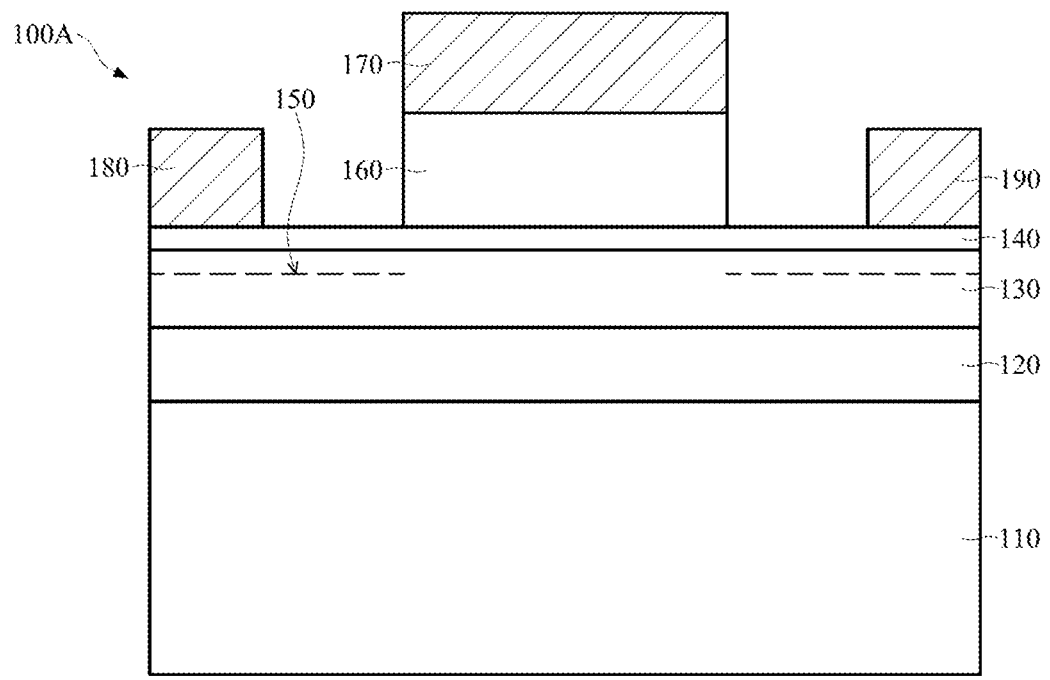

Next, as shown in FIG. 1D, a source electrode 180 and a drain electrode 190 are formed on the barrier layer 140. Ohmic contacts are formed between the barrier layer 140 and both the source electrode 180 and the drain electrode 190 by an annealing process. Then, a gate electrode 170 is formed on the depletion layer 160 to form the HEMT 100A. The material of the gate electrode 170 comprises one or a plurality of layers of conductive materials such as polysilicon, Al, Cu, Ti, Ta, W, Co, Mo, tantalum nitride, nickel silicide, cobalt silicide, titanium nitride, tungsten nitride, TiAl, TiAlN, TaCN, TaC, TaSiN, metal alloy or other suitable materials. Source electrode 180 and drain electrode 190 comprise one or more conductive materials, such as Ti, Al, Ni, Au or a combination thereof. The gate electrode 170, the source electrode 180 and the drain electrode 190 can be formed by physical vapor deposition, chemical vapor deposition, atomic layer deposition, coating, sputtering or other suitable process.

In another embodiment, a dielectric layer can be formed between the upper surface of the barrier layer 140 and both the source electrode 180 and the drain electrode 190 to cover the depletion layer 160, thereby reducing leakage current on the surface of the device and improving reliability. The material of the dielectric layer includes an oxide such as silicon oxide or aluminum oxide, or a nitride such as silicon nitride. Referring to FIG. 1D, the electron concentration of the 2DEG 150 under the depletion layer 160 is depleted or disappeared due to the reverse polarization of the depletion layer 160, so that the HEMT 100A is in off-state when no bias is applied on the gate electrode 170. To turn on the HEMT 100A, a bias greater than a threshold voltage (Vth) is required.

Figure 2:
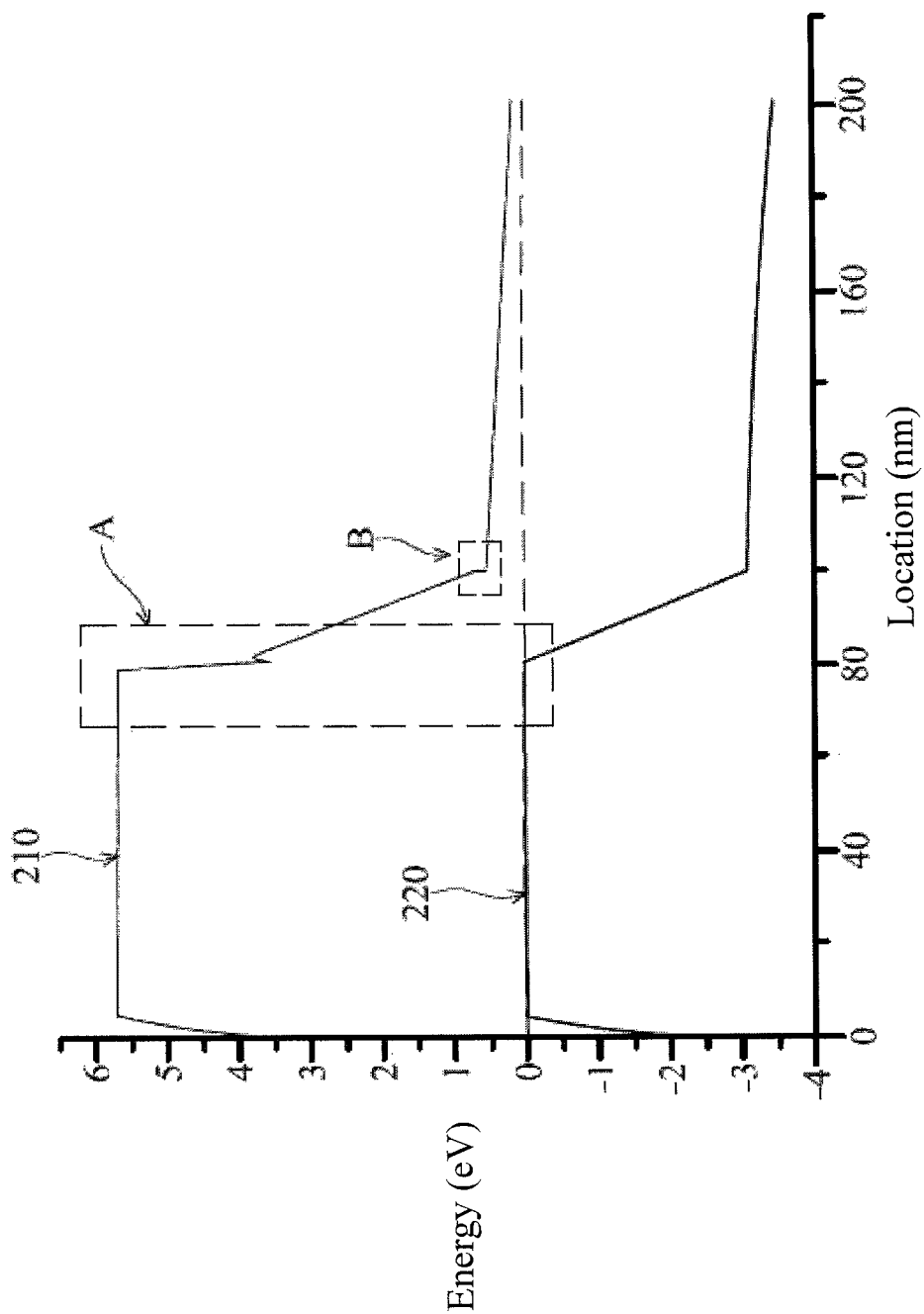
FIG. 2 shows a relationship between energy bands and positions within a HEMT in accordance with an embodiment of the present application.
Figure 3:
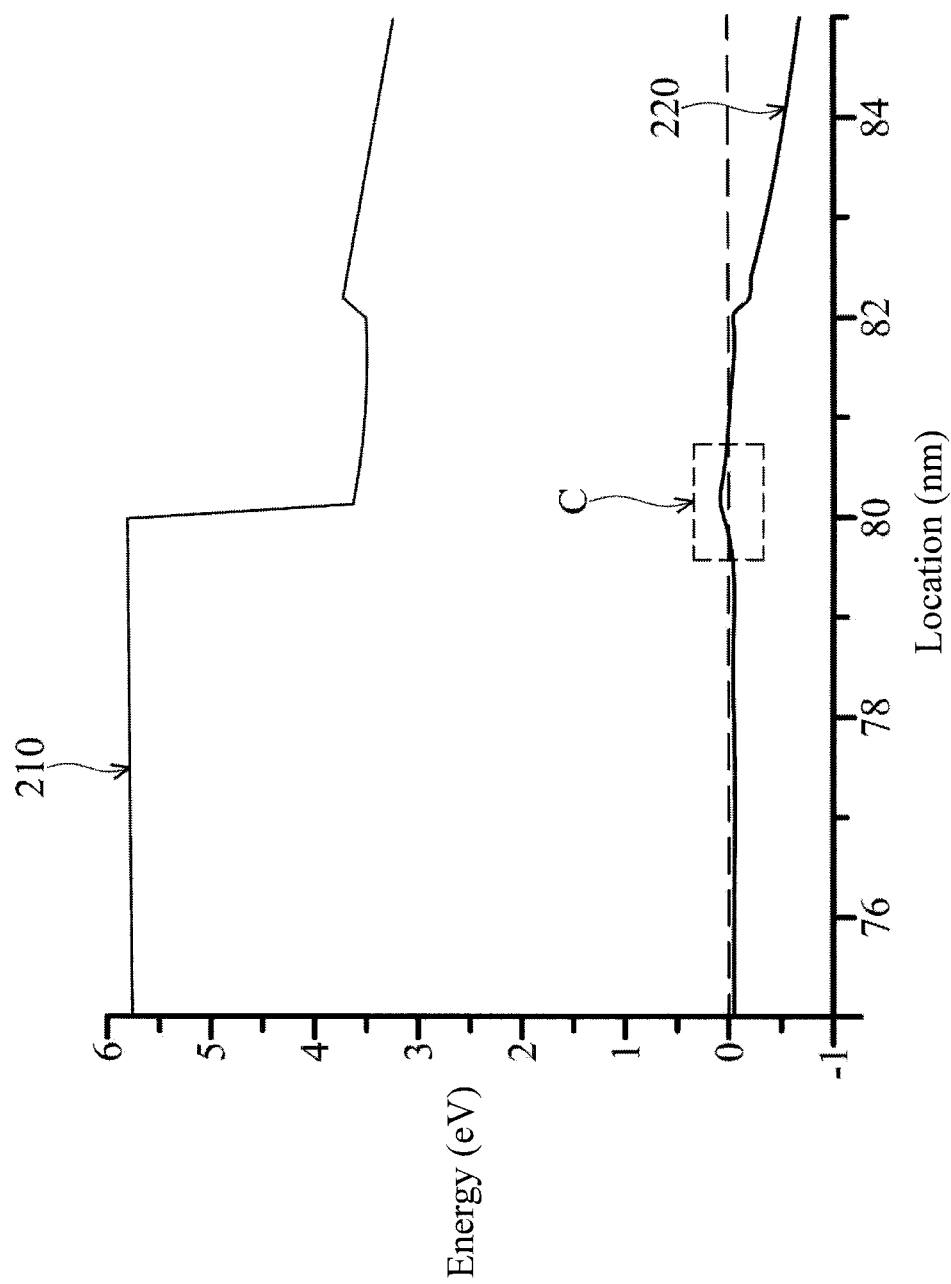
FIG. 3 shows an enlarged view of an area A in FIG. 2.

Referring to FIGS. 2 and 3, FIG. 2 shows the relationship between the energy levels of the conduction band 210 and the valence band 220 and the position within the HEMT 100A in accordance with an embodiment of the present application, and FIG. 3 is an enlarged view of the area A of FIG. 2. In the present embodiment, the buffer layer 120 has a thickness of 0.1 the channel layer 130 has a thickness of 50 nm, the barrier layer 140 has a thickness of 18 nm and the depletion layer 160 has a thickness of 80 nm, wherein the depletion layer 160 includes p-type hexagonal boron nitride. As shown in FIG. 2, the energy of the Fermi level is set to 0 eV and the position of the interface between the gate electrode 170 and the depletion layer 160 is set to 0 nm. The positive direction of the horizontal axis represents the direction from the interface of the gate electrode 170 and the depletion layer 160 toward the substrate 110. The vertical axis represents the energy of the energy level. As shown in FIG. 2, in the HEMT 100A having the depletion layer 160 with p-type hexagonal boron nitride, the energy level of the conductive band 210 near the depth of 100 nm (i.e. the area B which is between the channel layer 130 and the barrier layer 140) is about 0.4 eV to 0.7 eV while the energy level of the conductive band corresponding to this region in a conventional HEMT having a depletion layer with gallium nitride is between 0 eV to 0.1 eV. When p-type hexagonal boron nitride is selected as the material of the depletion layer 106, a higher bias voltage is required to turn on the HEMT 100A, thereby increasing the threshold voltage (Vth) of the HEMT. Consequently, a possibility of malfunction in the HEMT due to external interference such as surge is reduced.

Figure 4:
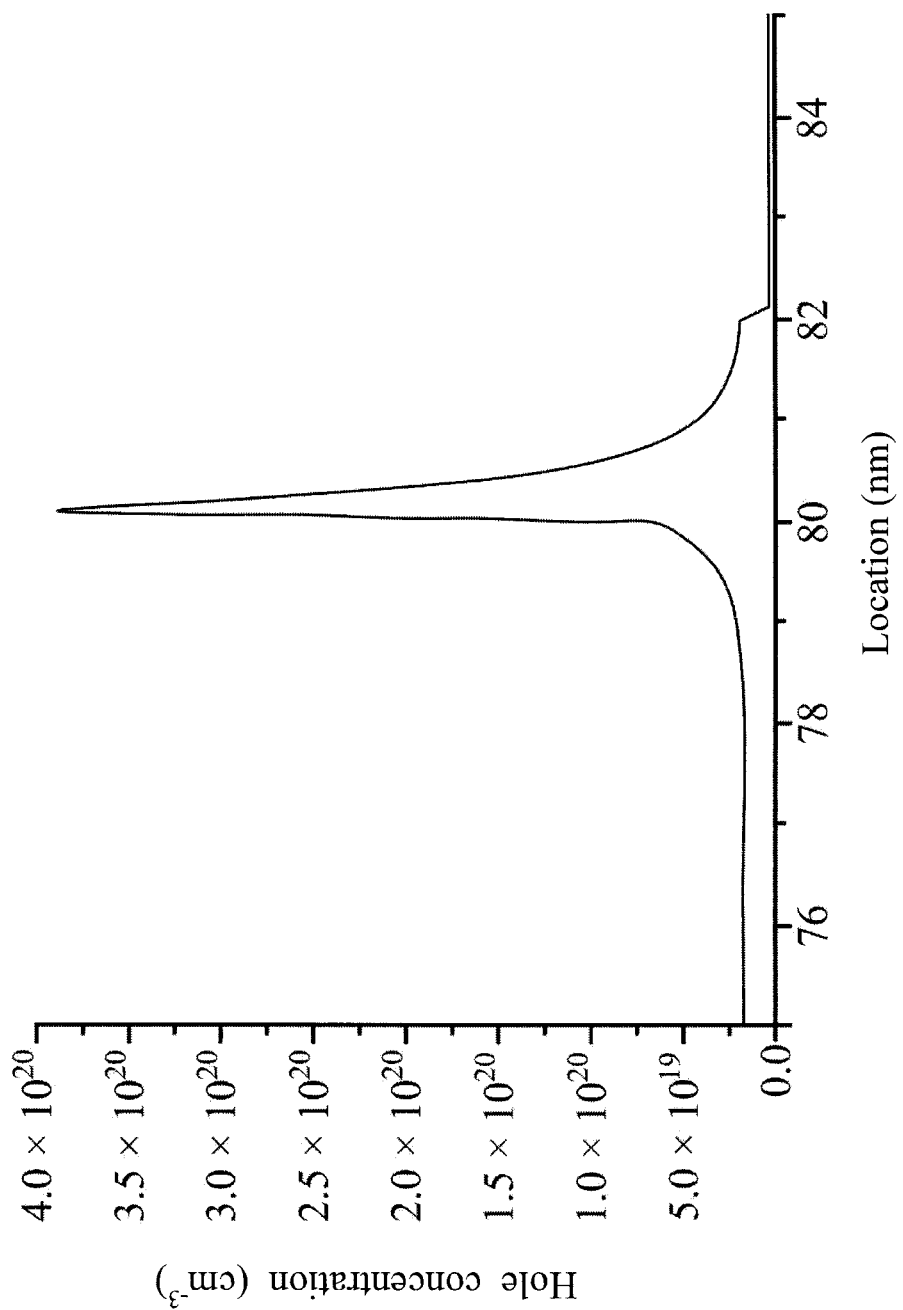
FIG. 4 shows a relationship between hole concentration and positions within a HEMT in accordance with an embodiment of the present application.

Furthermore, as shown in FIGS. 2 and 3, because the depletion layer 160 of the HEMT 100A includes p-type hexagonal boron nitride, the energy level of the valence band 220 is greater than Fermi level so that a two-dimensional hole gas (2DHG) is generated in the barrier layer 140 near the depletion layer 106, which is shown by the area C in FIG. 3. FIG. 4 shows the relationship between the hole concentration of the HEMT 100A and the position (or depth) within the HEMT 100A in accordance with the above embodiment. The positive direction of the horizontal axis represents the direction from the interface of the gate electrode 170 and the depletion layer 160 toward the substrate 110. The vertical axis represents the hole concentration. As shown in FIG. 4, when the depth is less than 79 nm or greater than 82 nm, the hole concentration is much smaller than $10^{19}/cm^3$. However, when the depth is approximately equal to 80 nm (that is, between the depletion layer 160 and the barrier layer 140), the hole concentration is up to $3 \times 10^{20}/cm^3$. Consequently, even no bias applied on the HEMT 100A, a 2DHG is formed in the barrier layer 140 near the depletion layer 106.

Figure 5:
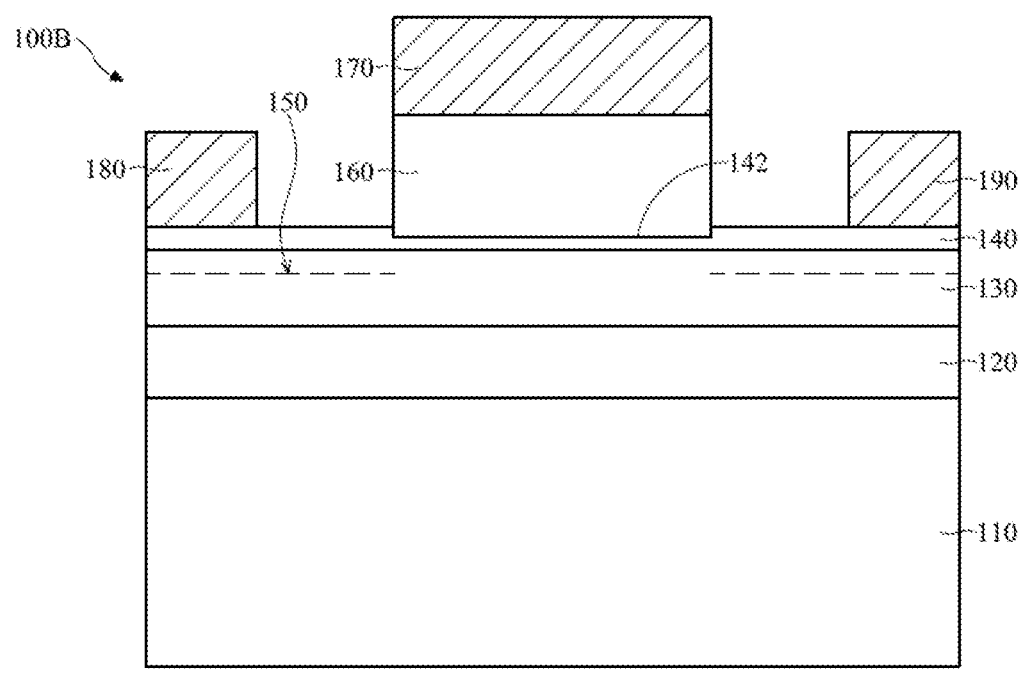
FIG. 5 shows a cross-sectional view of a HEMT in accordance with another embodiment of the present application.

FIG. 5 is a cross-sectional view of a HEMT 100B in accordance with another embodiment of the present application. Different from the HEMT 100A of FIG. 1D, the barrier layer 140 of the HEMT 100B has a recess 142 at a position corresponding to the depletion layer 160. Parts of the depletion layer 160 or the entire depletion layer 160 is in the recess 142. After the barrier layer 140 is completed as shown in FIG. 1B, an etching process is performed to remove a portion of the barrier layer 140 to form the recess 142. In one embodiment, the etching process is a dry etching process such as reactive ion etching (RIE) or high density plasma etching. The etchant of the etching process includes halogen such as F or Cl. The etchant can be $CH_3F$, $CH_2F_2$, $CHF_3$, $CF_4$, $Cl_2$, $BCl_3$ or other suitable gas. As shown in FIG. 5, the recess 142 is located directly under the depletion layer 160. Due to the recess 142, the thickness of the barrier layer 140 directly under the depletion layer 160 can be thinned, so that the depletion layer 160 has an enhanced reverse polarization between the channel layer 130 and the barrier layer 140. The electron concentration of the 2DEG 150 directly under the depletion layer 160 can be reduced or depleted without increasing the thickness of the depletion layer 160 to complete the high electron mobility transistor 100B.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A high electron mobility transistor, comprising:
   a substrate;
   a channel layer formed on the substrate;
   a barrier layer formed on the channel layer;
   a source electrode and a drain electrode formed on the barrier layer;
   a depletion layer formed on the barrier layer and between the source electrode and the drain electrode, wherein a material of the depletion layer comprises boron nitride or hexagonal zinc oxide; and
   a gate electrode formed on the depletion layer.

2. The high electron mobility transistor according to claim 1, further comprising a dielectric layer formed on the barrier layer and located between the depletion layer and both the source electrode and the drain electrode.

3. The high electron mobility transistor according to claim 1, wherein the material of the depletion layer comprises a single crystal structure.

4. The high electron mobility transistor according to claim 1, wherein the boron nitride of the depletion layer comprises hexagonal boron nitride (h-BN).

5. The high electron mobility transistor according to claim 1, wherein the material of the depletion layer is doped with impurities.

6. The high electron mobility transistor according to claim 5, wherein the material of the depletion layer comprises boron nitride and the impurities comprise Mg, Be, Zn or Cd.

7. The high electron mobility transistor according to claim 6, wherein the impurities comprise Mg and a concentration of Mg in the boron nitride is between $1 \times 10^{19}$ atoms/cm$^3$ to $1 \times 10^{21}$ atoms/cm$^3$.

8. The high electron mobility transistor according to claim 5, wherein the material of the hexagonal zinc oxide comprises the impurities selected from at least one of N and P.

9. The high electron mobility transistor according to claim 1, wherein the barrier layer comprises a recess and the depletion layer is in the recess.

10. A method of manufacturing a high electron mobility transistor, comprising:
    forming a channel layer;
    forming a barrier layer on the channel layer;
    forming a depletion layer on the barrier;
    forming a source electrode and a drain electrode on the barrier layer; and
    forming a gate electrode on the depletion layer;
    wherein a material of the depletion layer comprises boron nitride or hexagonal zinc oxide.

11. The method according to claim 10, wherein the boron nitride of the depletion layer comprises hexagonal boron nitride and the method further comprises doping impurities in the hexagonal boron nitride; and
    wherein the impurities comprise Mg, Be, Zn or Cd.

12. The method according to claim 11, further comprising activating the impurities at a temperature between 600° C. and 800° C.

13. The method according to claim 11, wherein the impurities comprise Mg and a concentration of Mg in the hexagonal boron nitride is between $1 \times 10^{19}$ atoms/cm$^3$ to $1 \times 10^{21}$ atoms/cm$^3$.

14. The method according to claim 10, further comprising doping impurities in the hexagonal zinc oxide, wherein the impurities comprise N or P.

15. The method according to claim 10, further comprising removing a portion of the barrier layer to form a recess in the barrier layer; and forming the depletion layer in the recess.

* * * * *